United States Patent [19]
Koike

[11] Patent Number: 4,491,746
[45] Date of Patent: Jan. 1, 1985

[54] SELF-SUBSTRATE-BIAS CIRCUIT DEVICE

[75] Inventor: Hideharu Koike, Chigasaki, Japan

[73] Assignee: Tokyo Shibaura Denki Kabushiki Kaisha, Kawasaki, Japan

[21] Appl. No.: 304,035

[22] Filed: Sep. 21, 1981

[30] Foreign Application Priority Data

Sep. 24, 1980 [JP] Japan ..................... 55-132626

[51] Int. Cl.³ ............... H01L 27/04; H01L 29/94; H03L 1/00
[52] U.S. Cl. ................. 307/296 R; 307/303; 357/23
[58] Field of Search .......... 307/296 A, 304, 296 R, 307/303; 357/23 C, 42, 41, 23 CS

[56] References Cited

U.S. PATENT DOCUMENTS

| | | | |
|---|---|---|---|
| 4,007,478 | 2/1977 | Yagi | 357/23 VD X |
| 4,016,594 | 4/1977 | Shappir | 357/23 S X |
| 4,044,373 | 8/1977 | Nomiya et al. | 357/86 X |
| 4,115,794 | 9/1978 | De La Moneda | 357/23 C |
| 4,216,489 | 8/1980 | Clemens et al. | 357/41 |
| 4,255,756 | 3/1981 | Shimotori et al. | 307/304 X |
| 4,377,756 | 3/1983 | Yoshihara et al. | 307/304 X |

Primary Examiner—Larry N. Anagnos
Assistant Examiner—David R. Bertelson
Attorney, Agent, or Firm—Finnegan, Henderson, Farabow, Garrett & Dunner

[57] ABSTRACT

A self-substrate-bias circuit device comprising substrate of P conductivity type, a capacitor element of MOS construction formed in said semiconductor substrate and whose one end is connected to the output terminal of a pulse generator, a diode element formed in said semiconductor substrate and connected between the other end of said capacitor element and a ground potential, and an P+ region of P conductivity type formed in the region of said seminconductor substrate which is contacted to said capacitor element and having higher impurity concentration than that of said semiconductor substrate.

10 Claims, 4 Drawing Figures

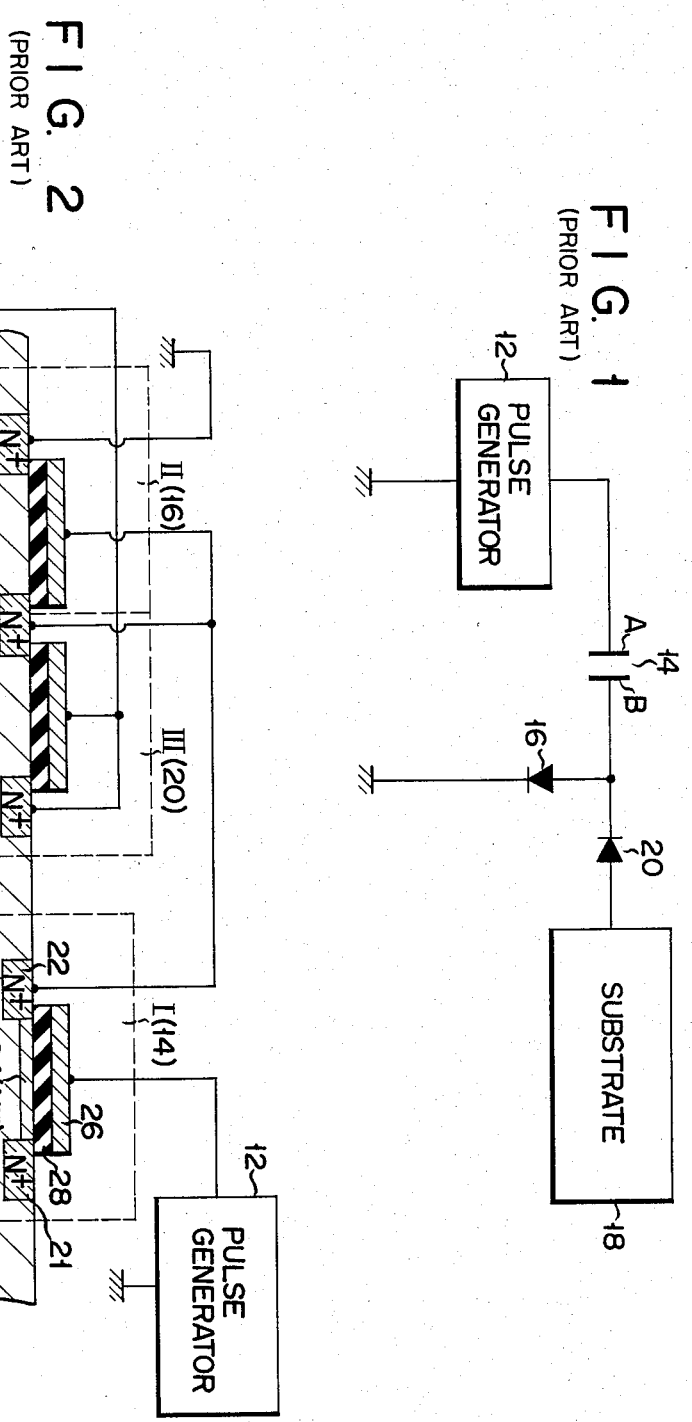

SELF-SUBSTRATE-BIAS CIRCUIT DEVICE

BACKGROUND OF THE INVENTION

The present invention relates to a self-substrate-bias circuit used in a semiconductor apparatus and, more particularly, a constructional improvement of the capacitor section in the self-substrate-bias circuit device.

In the case where a single power source is used with a semiconductor device such as in a MOS (metal oxide semiconductor) integrated circuit, for example, the bias voltage to be applied to the semiconductor substrate is usually provided through the self-substrate-bias circuit arranged on the semiconductor chip. FIG. 1 shows a circuit diagram of such a bias circuit device. Namely, the bias circuit comprises a capacitor 14 whose one electrode plate A is connected to the output terminal of a pulse generator 12, a diode 16 connected between the other electrode plate B of capacitor 14 and a reference potential such as ground potential, for example, and a diode 20 connected between the electrode plate B of capacitor 14 and a semiconductor substrate 18.

FIG. 2 shows roughly a conventional practical circuit arrangement of the circuit device shown in FIG. 1. MOS structural elements enclosed by broken line blocks I, II and III in FIG. 2 are used to form the capacitor 14 and diodes 16 and 20, respectively. To explain the block I of capacitor 14, N+ regions 21, 22 and N− region 24 form the electrode plate B of capacitor 14, and a conductive gate film 26 forms the electrode plate A of capacitor 14. Numeral 28 denotes a gate insulation film.

Bias voltage having a magnitude depending upon the amplitude of output pulse of pulse generator 12 and the forward voltage of diodes 16 and 20 is applied to the substrate 18 in the arrangement described above. When potential on the input side of capacitor 14 is high, electrons are supplied to the output side of capacitor 14 from the ground. When potential on the input side changes from high to low, electrons stored on the output side diffuse into the substrate to combine with holes. Namely, that region of substrate 18 which is contacted to the electrode plate B on the output side of capacitor 14, in other words, that region of substrate 18 which is contacted to N+ regions 21, 22 and N− region 24 of capacitor 14 in FIG. 2 is a region from which electrons diffuse.

In the case of devices such as dynamic RAM (Random Access Memory) and CCD (Charge Coupled Device) in which potential wells are formed, electrons diffusing, as described above, into the substrate 18 from the bias circuit device formed on the same clip on which these devices are formed can enter into potential wells causing these device to malfunction. When the substrate is intended to have high resistance, the impurity concentration of the substrate becomes low and the diffusing distance of electrons becomes large. Therefore, even if devices such as RAM and CCD are arranged remote from the bias circuit device, devices such as RAM and CCD can be adversely influenced by diffusing electrons. In addition, when the impurity concentration of the substrate becomes low, capacitance between the substrate and ground becomes small causing the self-substrate-bias voltage to be unstable.

SUMMARY OF THE INVENTION

The present invention is intended to eliminate these drawbacks.

The object of the present invention is therefore to provide a self-substrate-bias circuit device capable of preventing electrons from diffusing from the capacitor section into the substrate so that other devices formed in the substrate are uninfluenced by diffusing electrons and increasing substrate capacitance to make the self-substrate-bias voltage stable.

According to the present invention a self-substrate bias circuit device is provided comprising a semiconductor substrate of a first conductivity type; a capacitor element of MOS construction formed in said semiconductor substrate one side of which is connected to the output terminal of a pulse generator; a diode element formed in said semiconductor substrate and connected between the other side of said capacitor element and a reference potential; and a region of first conductivity type formed in that portion of the semiconductor substrate which is contacted to said capacitor element and having a higher impurity concentration than that of said semiconductor substrate.

BRIEF DESCRIPTION OF THE DRAWINGS

FIG. 1 is a circuit diagram showing a conventional self-substrate-bias circuit device.

FIG. 2 is a sectional view roughly showing the construction of the conventional device shown in circuit diagram in FIG. 1.

DETAILED DESCRIPTION OF THE PREFERRED EMBODIMENTS

Figure 3:
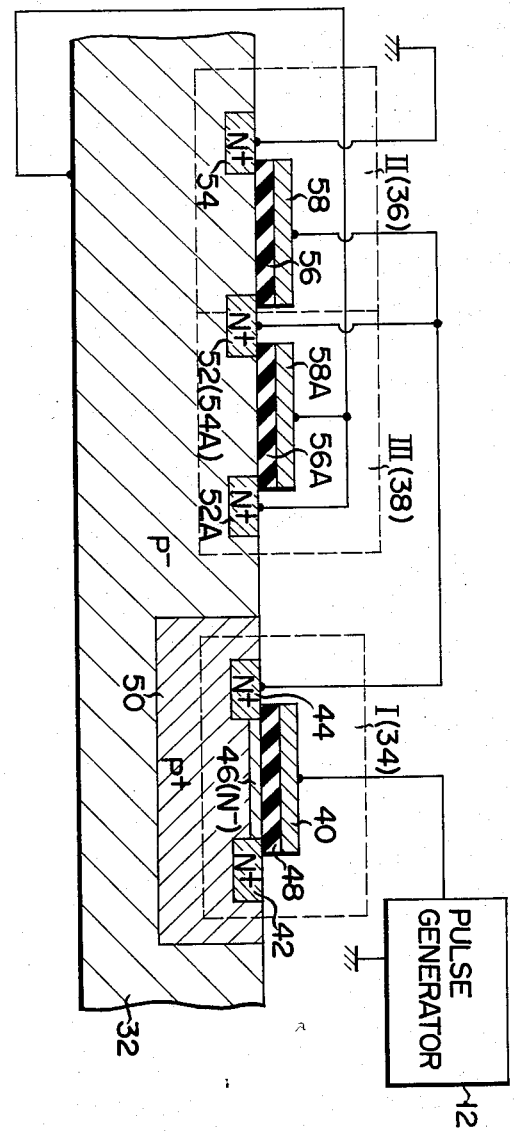
FIG. 3 is a sectional view roughly showing an example of a self-substrate-bias circuit device according to the present invention.

Embodiments of the present invention will be described referring to the drawings.

Referring to FIG. 3, MOS elements 34, 36 and 38 of N-channel type enclosed by broken line blocks I, II and III are formed in a semiconductor substrate 32 of P− conductivity type. MOS elements 34, 36 and 38 correspond to the capacitor 14 and diodes 16, 20, respectively, shown in circuit diagram in FIG. 1.

To describe the MOS element 34 first, a conductive gate film 40 made of policrystal line silicon, for example, forms the electrode plate A on the input side of capacitor 14. On the other hand, regions 42 and 44 of N+ conductivity type and region 46 of N− conductivity type interposed between these regions 42 and 44 form the electrode plate B on the output side of capacitor 14. The N− region 46 is intended to render N+ regions 42 and 44 electrically conductive and to keep both N+ regions 42 and 44 at the same potential. Numeral 48 represents a gate insulation film formed between the N− region 46 and the conductive gate film 40 and made of $SiO_2$, for example. In the area of substrate 32 contacted with the capacitor 14 and, more concretely, with N+ regions 42, 44 and N− region 46 which form the electrode plate B on the output side of capacitor 14 there is formed a region 50 of P+ conductivity type having higher impurity concentration than that of substrate 32 and enclosing N+ regions 42, 44 and N− region 46. The impurity concentration substrate 32 is of about $10 \text{ cm}^{-3}$, for example, and that P+ region 50 of about $10^{18} \text{ cm}^{-3}$, for example.

To describe the arrangement of diodes 36 and 38, these diodes 36 and 38 have the same arrangement as that of conventional ones and are also the same in arrangement to each other. Therefore, only the diode 36 is described and components of diode 38 corresponding to those of diode 36 are shown by same numerals to which "A" is affixed. The diode 36 comprises regions 52 and 54 of N+ conductivity type formed in the substrate 32, a gate insulation film 56 formed on the substrate 32 between these N+ regions 52 and 54 and made of $SiO_2$, for example, and a conductive gate film 58 formed on the gate insulation film 56 and made of polycrystal line silicon. The N+ region 52 and gate film 58 are commonly connected to each other to form a section on the side of the anode and the N+ region 54 forms a section on the side of the cathode. The N+ regions 52 is used as a component element common to diodes 36 and 38 and also as a section 54A on the cathode side of diode 38.

To describe the circuit connection between MOS elements 34, 36 and 38 as described above, the conductive gate film 40 which forms the electrode plate on the input side of capacitor element 34 is connected to the output terminal of pulse generator 12. N+ regions 42, 44 and N− region 46 are connected to the conductive gate film (or anode side region) 58 of diode element 36 and to the N+ region 52(54A) which is common to diode elements 36 and 38 and which is the anode side region of diode element 36 and the cathode side region of diode element 38. The N+ region 54 (or cathode side region) of diode element 36 is connected to ground potential. The N+ region (or anode side region) 52A of diode element 38 is connected to the conductive gate film 56A and substrate 32.

The self-substrate-bias circuit device shown in FIG. 3 in which the output terminal of pulse generator 12 is connected to one electrode plate (or conductive gate film 40) of MOS capacitor element 34, the first diode element 36 is connected between the other electrode plate (or N+ regions 42, 44 and N− region 46) of capacitor element 34 and ground, the second diode element 38 is connected between the other electrode plate of capacitor element 34 and the substrate 32 is characterized in that the impurity concentration in the portion of substrate 32 surrounding and contacting the capacitor element 34 is made higher than that of substrate 32.

In the circuit device having an arrangement as described above, the bias voltage having a magnitude depending upon the amplitude of output pulse of pulse generator 12 and forward voltage $V_F$ of diodes 36 and 38 is supplied to the substrate 32 at the time when the device is operated. When potential on the input side of capacitor 34 is high, electrons are supplied from ground to the output side of capacitor 34 and when the potential on the input side thereof changes from high to low, electrons stored on the output side thereof tend to diffuse into the substrate 32. However, in the portion of the substrate surrounding capacitor 34, in other words, in the substrate around regions 42, 44 and N− region 46 there is formed P+ region 50 having higher impurity concentration than that of substrate 32. Therefore, diffusing electrons combine with holes in the P+ region 50 thus preventing many electrons from diffusing into the substrate 32. Electrons are thus prevented from diffusing into the potential well section (not shown) of IC devices such as dynamic RAM and CCD formed in other portions of substrate 32. Therefore, malfunction and the like of RAM and CCD caused because electrons enter into the potential well section can be prevented. It is particularly effective with semiconductor devices in which the inpurity concentration of the substrate tends to be low and the diffusing distance of electrons is large. Because the substrate used these days tends to have high resistance, that the P+ region 50 is formed like this to suppress the diffusion of electrons and to make the diffusion length of electrons short. In addition, the impurity concentration of substrate 32 is made high due to the formation of P+ region 50, thus increasing the capacitance between the substrate 32 and the ground to make the self-substrate bias voltage stable.

The effect of suppressing electrons is available even when the impurity concentration of P+ region 50 is only a little higher than that of substrate 32 and becomes larger as the impurity concentration of P+ region 50 becomes higher and higher. Since the capacitor element 34 and diodes 36, 38 are all MOS-constructed, the number of processes for forming the diffusing region is less to make the manufacture of the device easier.

Figure 4:
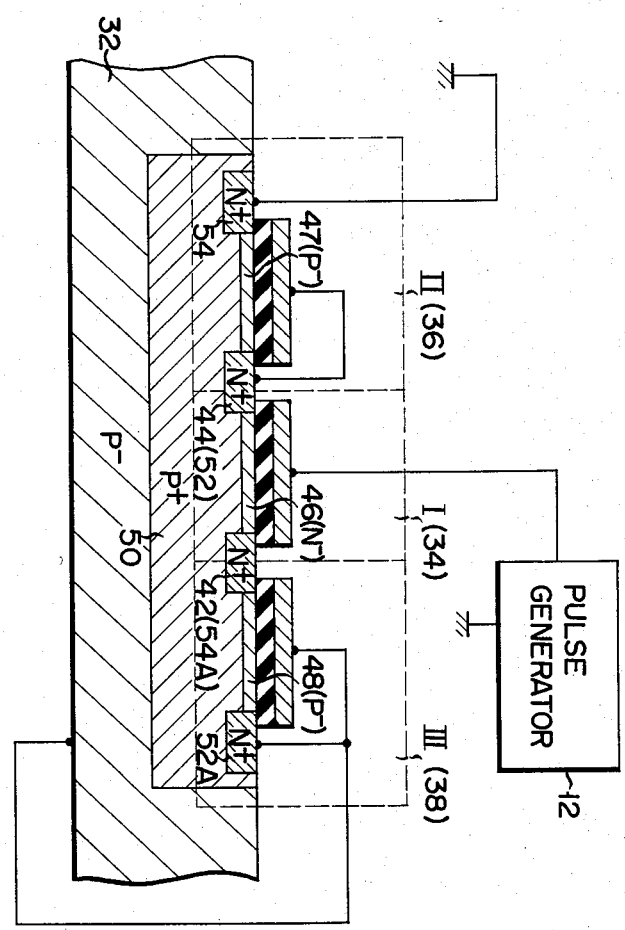
FIG. 4 is a sectional view similar to FIG. 3 and showing another example of a self-substrate-bias circuit device according to the present invention.

FIG. 4 shows another embodiment of the present invention. Omitting the description of same parts as those of the embodiment shown in FIG. 3, only parts different from those of the embodiment shown in FIG. 3 will be now described. Two N+ regions 42 and 44 which form the capacitor element 34 are used as regions respectively common to the diode 38 and to the diode 36 in this embodiment. Namely, the N+ region 42 of capacitor element 34 is also used as cathode side region 54A of diode 38 and the N+ region 44 of capacitor element 34 as anode side region of diode element 36. Further, a region 47 of P− conductivity type is interposed between N+ regions 54 and 44 to control the forward voltage $V_F$ of the diode 36. Similarly, a region 48 of P− conductivity type is interposed between N+ regions 42 and 52A to control the forward voltage $V_F$ of the diode 38. The P− regions 47 and 48 may be formed by, for example, ion implantation technique using arsenic As or phosphorus P, for example. The P+ region 50 encloses, in this embodiment of FIG. 4, N+ regions 42, 44, 52A and 54, N− region 46 and P− regions 47 and 48. That is, the P+ region 50 is formed in that region in the semiconductor substrate 32 which surrounds and contacts to N+ regions 42, 44, 52A and 54, N− region 46 and P− regions 47 and 48.

As described above referring to the first embodiment, the diffusion of electrons from the capacitor element 34 to the substrate 32 can be suppressed by the P+ region 50 in this second embodiment. In addition, this second embodiment has also the effect of increasing the capacitance between the substrate 32 and ground to make the self-substrate-bias voltage stable. Further, the capacitor element 34 and diode elements 36, 38 are all MOS-constructed and the number of processes for forming the diffusion region can be less to make the manufacture of device easier.

The same effect can also be obtained in either the first or second embodiments when the diffusion depth of P+ region 50 is made larger instead of enhancing the impurity concentration of P+ region 50. Any of the first and second embodiments have been arranged to have N-channel MOS construction. "Electrons" should be read as "holes" throughout the specification in the case of P-channel MOS construction. Further, although the N+ region 54 on the anode side of diode element 36 is connected to ground, that is, ground potential, it is not necessarily connected to the ground potential but may be connected to an appropriate reference potential. Furthermore, in the FIG. 3 and FIG. 4 embodiments, the diode element 38 of MOS construction is arranged to form the diode 20 in the circuit diagram shown in FIG. 1. Since, however, a PN junction between the substrate 32 and the N+ region 52 in the FIG. 3 embodiment forms a diode substantially equivalent to the diode 20, the MOS element forming the second diode element 38 may not have to be provided. Similarly, a PN junction between the substrate 32 and the N+ region 42 in the FIG. 4 embodiment forms the equivalent diode, the MOS element forming the second diode element 38 may not have to be provided.

As described above, the self-substrate-bias circuit device of the present invention in which that region of substrate 32 which is surrounds and contacts the MOS component elements forming the capacitor element 34 is formed as P+ region 50 having higher impurity concentration so that diffusion of electrons from the capacitor element 34 to the substrate 32 can be suppressed. In this way devices such as dynamic RAM and CCD are not adversely effected and that the capacitance between the substrate 32 and ground is increased to stabilize the self-substrate-bias voltage.

It should be understood that the present invention is not limited to embodiments as described above and that various modifications can be achieved by skilled persons in the field without departing from the spirit and scope of the present invention.

What is claimed is:

1. A self-substrate-bias circuit device for use with a pulse generator comprising:
   a semiconductor substrate of a given conductivity type;
   a capacitor element of MOS construction formed in said semiconductor substrate having a first side connected to the output terminal of the pulse generator;
   a first diode formed in said semiconductor substrate and connected between the other side of said capacitor element and a reference potential; and
   a region of said conductivity type formed in a portion of said semiconductor substrate which is contacted to and surrounding said capacitor element and having higher impurity concentration than that of said semiconductor substrate so that carriers from said capacitor element recombine with carriers existing in said region.

2. A self-substrate-bias circuit device according to claim 1 further including a second diode formed between the other side of said capacitor element and said semiconductor substrate.

3. A self-substrate-bias circuit device according to claim 1 or 2 wherein said capacitor element is of N-channel type.

4. A self-substrate-bias circuit device according to claim 1 or 2 wherein said capacitor element is of P-channel type.

5. A self-substrate-bias circuit device according to claim 1 or 2 wherein said first and second diodes are MOS-constructed.

6. A self-substrate-bias circuit device according to claim 5 wherein said first and second diodes are of N-channel type.

7. A self-substrate-bias circuit device according to claim 5 wherein said first and second diodes are of P-channel type.

8. A self-substrate-bias circuit device according to claim 1 wherein said reference potential is a ground potential.

9. A self-substrate-bias circuit device according to claim 2 wherein said region is formed to surround said capacitor element and said two diodes.

10. A self-substrate-bias circuit device according to claim 2 wherein each of said diodes has an anode and a cathode section separated by a region which is of said given conductivity type and has an impurity concentration lower than that of said region contacted to and surrounding said capacitor element.

* * * * *